(12) United States Patent
Ahmad

(10) Patent No.: US 6,281,092 B1
(45) Date of Patent: Aug. 28, 2001

(54) METHOD FOR MANUFACTURING A METAL-TO-METAL CAPACITOR UTILIZING ONLY ONE MASKING STEP

(75) Inventor: Aftab Ahmad, Colorado Springs, CO (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/347,487

(22) Filed: Jul. 2, 1999

(51) Int. Cl.$^7$ ................................................ H01L 21/8242
(52) U.S. Cl. .......................... 438/396; 438/240; 438/253; 438/692
(58) Field of Search ................................ 438/3, 240, 396, 438/397, 253, 254, 692; 257/310

(56) References Cited

U.S. PATENT DOCUMENTS

| | | | |
|---|---|---|---|
| 5,270,241 | * 12/1993 | Dennison et al. | 438/253 |
| 5,346,844 | * 9/1994 | Cho et al. | 438/253 |
| 5,576,240 | 11/1996 | Radosevich et al. . | |
| 5,691,219 | * 11/1997 | Kawakubo et al. | 438/396 |
| 5,719,073 | 2/1998 | Shaw et al. . | |
| 5,789,303 | * 8/1998 | Leung et al. | 438/381 |
| 5,792,689 | 8/1998 | Yang et al. . | |
| 5,807,775 | 9/1998 | Tseng . | |
| 5,858,831 | * 1/1999 | Sung | 438/241 |
| 5,976,928 | * 11/1999 | Kirlin et al. | 438/240 |
| 6,103,568 | * 8/2000 | Fujiwara | 438/253 |

* cited by examiner

*Primary Examiner*—Carl Whitehead, Jr.
*Assistant Examiner*—Toniae M. Thomas

(57) ABSTRACT

A capacitor is fabricated on a semiconductor substrate by first forming a first capacitor electrode on the semiconductor substrate and forming a planar insulating layer over the first capacitor electrode. A photoresist layer is then formed over the planar insulating layer and patterned utilizing in only masking step to form an opening over the first capacitor electrode. Through the opening, the planar insulating layer is etched, and a capacitor dielectric layer is thereafter formed. A second capacitor electrode is then formed over the capacitor dielectric layer in alignment with the first capacitor electrode. The structure is planarized to expose the planar insulating layer. In a preferred embodiment, a trench in the second capacitor electrode is protected during planarization by a spin-on photoresist that is stripped following planarization.

26 Claims, 2 Drawing Sheets

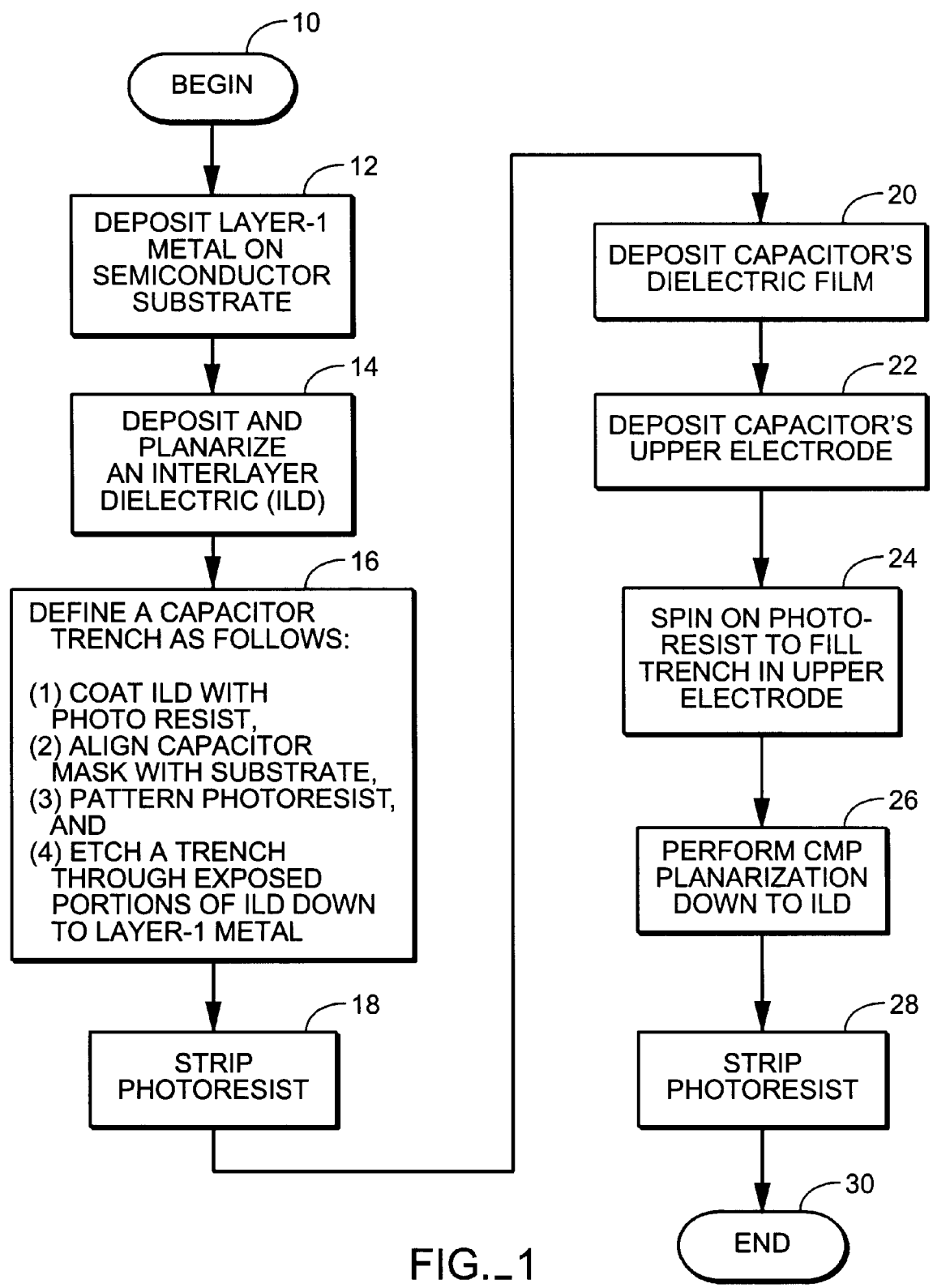
FIG._1

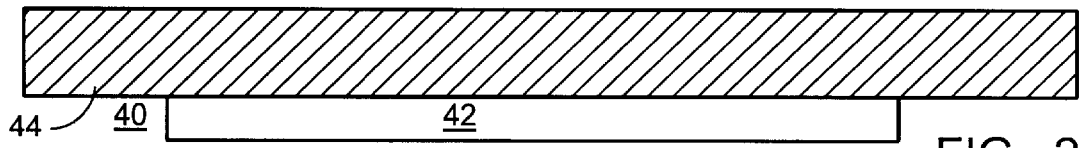
FIG._2
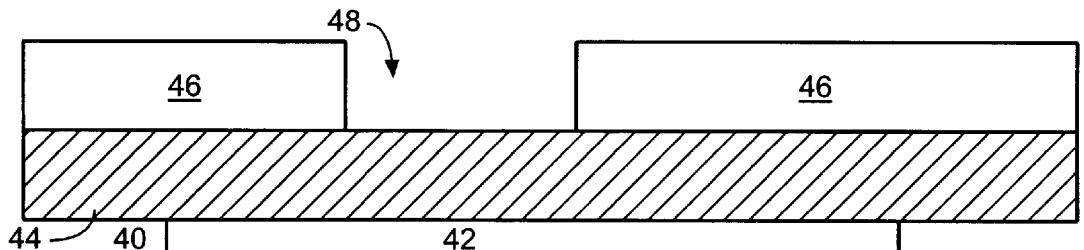
FIG._3
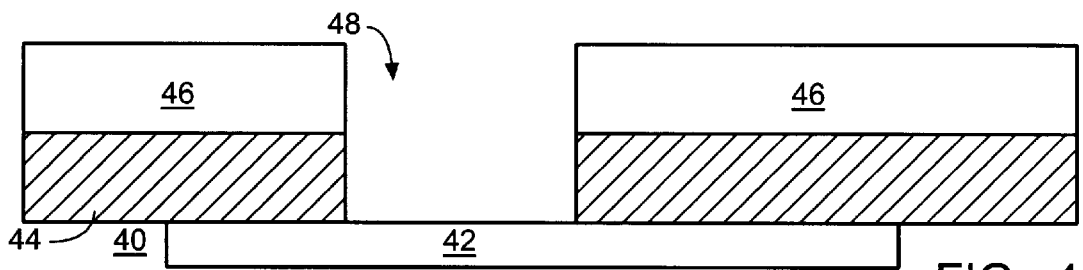
FIG._4
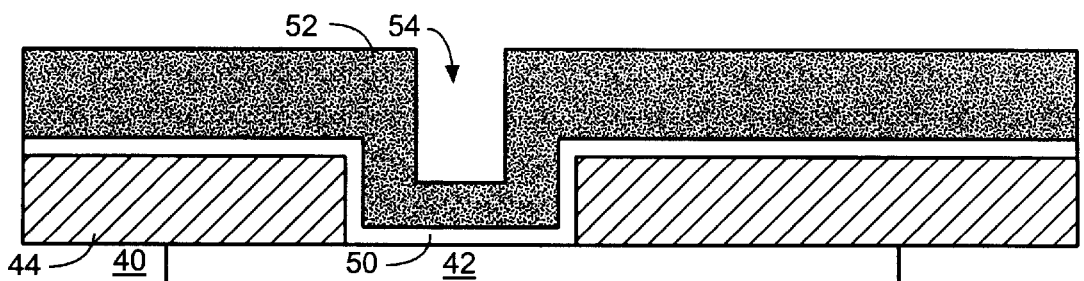
FIG._5
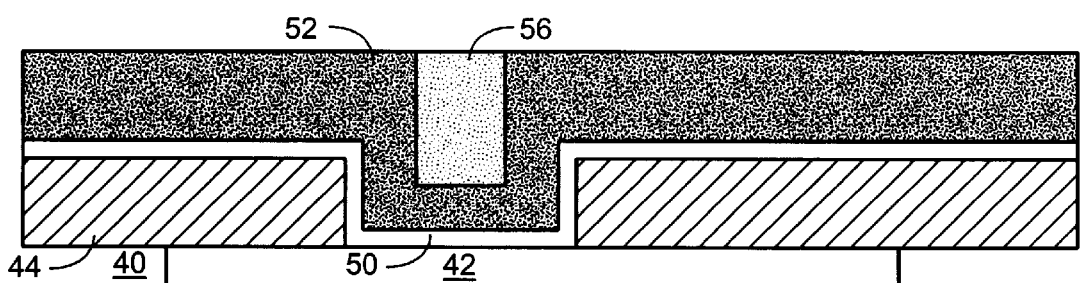
FIG._6
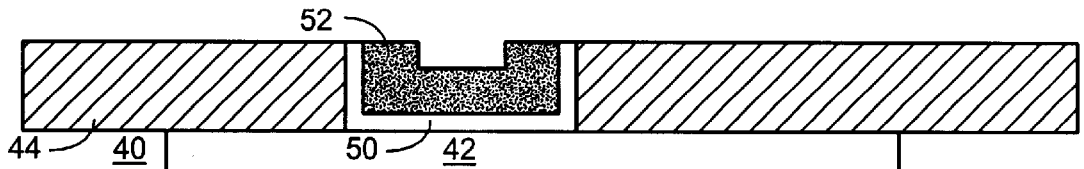
FIG._7

METHOD FOR MANUFACTURING A METAL-TO-METAL CAPACITOR UTILIZING ONLY ONE MASKING STEP

BACKGROUND OF THE INVENTION

1. Technical Field

The present invention relates in general to integrated circuits and in particular to the manufacture of a capacitor within an integrated circuit substrate. Still more particularly, the present invention relates to a method for manufacturing a metal-to-metal capacitor utilizing only a single masking step.

2. Description of the Related Art

The fabrication of an integrated circuit within a semiconductor substrate typically requires a number of processing steps, including one or more masking steps to define features of integrated circuit components. A masking step entails a number of subsidiary steps, the first of which is coating the surface of the integrated circuit with photoresist. A photolithographic mask is then precisely aligned with the semiconductor substrate and irradiated with ultraviolet light to remove portions of the photoresist and thereby define the location of a component feature. The defined location of the component feature is then selectively processed by removing material (e.g., with an etchant) or adding material (e.g., by deposition or implantation). The masking step then concludes with the removal of the photoresist.

Conventionally, the fabrication of a metal-to-metal capacitor within an analog integrated circuit has required at least two masking steps, a first masking step that defines the location of the lower plate of the capacitor and a second masking step that selectively etches the deposited capacitor dielectric. The present invention recognizes that such masking steps are some of the most expensive steps in the fabrication process, particularly considering the cost of creating the photolithographic mask and the processing time required to perform subsidiary steps like aligning the mask and exposing the photoresist. Consequently, the present invention provides an improved method of fabricating an integrated circuit capacitor that requires only a single masking step.

SUMMARY OF THE INVENTION

In accordance with the present invention, a capacitor is fabricated on a semiconductor substrate by first forming a first capacitor electrode on the semiconductor substrate and forming a planar insulating layer over the first capacitor electrode. A photoresist layer is then formed over the planar insulating layer and patterned in an only masking step to form an opening over the first capacitor electrode. Through the opening, the planar insulating layer is etched, and a capacitor dielectric layer is thereafter formed. A second capacitor electrode is then formed over the capacitor dielectric layer in alignment with the first capacitor electrode. The structure is planarized to expose the planar insulating layer. In a preferred embodiment, a trench in the second capacitor electrode is protected during planarization by a spin-on photoresist that is stripped following planarization.

All objects, features, and advantages of the present invention will become apparent in the following detailed written description.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

FIG. 1 depicts a high level logical flowchart of a process for manufacturing a metal-to-metal capacitor utilizing only a single masking step in accordance with the present invention; and FIGS. 2–7 illustrate cross-sectional views of an integrated circuit substrate at various stages within a process for manufacturing a metal-to-metal capacitor utilizing only a single masking step in accordance with the present invention.

DETAILED DESCRIPTION OF ILLUSTRATIVE EMBODIMENT

With reference now to the figures and in particular with reference to FIG. 1, there is depicted a high level logical flowchart of a process for manufacturing a capacitor on a semiconductor substrate utilizing only a single masking step in accordance with the present invention. The process shown in FIG. 1 will be described below with reference to FIGS. 2–7, which illustrate cross-sectional views of the semiconductor substrate at various stages within the process.

Referring first to FIG. 1, the process begins at block 10 and thereafter proceeds to block 12, which illustrates forming a first capacitor electrode by depositing a layer-one metallization over at least a selected region of the semiconductor substrate. The layer-one metallization is preferably aluminum, but polysilicon or other suitable material may alternatively be used. After the deposition of the layer-one metallization, an interlayer dielectric, such as silicon dioxide ($SiO_2$), is deposited over the first capacitor plate and planarized, as illustrated at block 14. The interlayer dielectric may have a thickness, for example, in the range of 50 to 500 A, and is preferably deposited at low temperature using Chemical Vapor Deposition (CVD) to avoid adversely affect the underlying layer-one metallization. Thus, as shown in FIG. 2, following block 14, a semiconductor substrate 40 has a first capacitor electrode 42 formed therein, and an interlayer dielectric 44 overlays both first capacitor electrode 42 and semiconductor substrate 40.

Returning to FIG. 1, the process proceeds from block 14 to block 16, which illustrates defining a capacitor trench. In order to form the capacitor trench, interlayer dielectric 44 is coated with a layer of photoresist 46, and a photolithographic capacitor mask is aligned with substrate 40. Photoresist layer 46 is then patterned by irradiating photoresist layer 46 with ultraviolet radiation through the capacitor mask. Photoresist layer 46 is preferably formed with a positive photoresist, although a negative photoresist may alternatively be employed. Following the patterning of photoresist layer 46, the capacitor structure appears as illustrated in FIG. 3. That is, photoresist layer 46 has been formed over interlayer dielectric 44, and a trench 48 aligned with first capacitor electrode 42 has been formed by exposing photoresist layer 46 through the capacitor mask. Thereafter, trench 48 is extended down to first capacitor electrode 42 by chemically etching interlayer dielectric 44 as shown in block 16 of FIG. 1 and in FIG. 4.

The process shown in FIG. 1 then proceeds to block 18, which depicts stripping (i.e., removing) photoresist layer 46. Next, at block 20, a thin capacitor dielectric in the range of 80–400 Å is deposited over interlayer dielectric 44 and within trench 48. As illustrated at block 22, the capacitor's second (upper) electrode is then deposited in a metallization step that forms a metallization layer over the top of the entire structure, including within trench 48. The second electrode is preferably formed of the same material as the first electrode. Following the metallization step depicted at block 22, the structure appears as illustrated in FIG. 5. As shown, semiconductor substrate 40, first capacitor electrode 42, and interlayer dielectric 44 remain as shown in FIG. 4. However, photoresist layer 46 has been removed, and capacitor dielectric film 50 and metallization 52 have been deposited. As is further illustrated in FIG. 5, metallization layer 52 has a trench 54 that is aligned with the opening in interlayer dielectric 44 and first capacitor electrode 42.

In order to protect trench 54 in metallization layer 52 and to protect capacitor dielectric film 50 from thinning at its upper corners during subsequent processing steps, trench 54 is filled with photoresist 56, as shown in FIG. 6. Importantly, as illustrated in block 24 of FIG. 1, the photoresist is spun on rather than applied and patterned with a mask. By utilizing a spin on technique rather than conventional photolithography, processing time and processing costs are greatly reduced.

Referring again to FIG. 1, following block 24, the process proceeds to block 26, which depicts planarizing the structure down to interlayer dielectric 44 by Chemical-Mechanical Polishing (CMP). The photoresist remaining in trench 54 is then stripped at block 28, and the fabrication process shown in FIG. 1 terminates at block 30.

Following the conclusion of the process shown in FIG. 1, the capacitor structure appears as illustrated in FIG. 7. As depicted, semiconductor substrate 40 has first capacitor electrode 42 formed therein and is overlaid with interlayer dielectric 44. Interlayer dielectric 44, which as shown may partially overlap with first capacitor electrode 42, has a opening aligned with first capacitor electrode 42 in which portions of capacitor dielectric film 50 and metallization layer 52 remain following CMP. The remaining portion of metallization layer 52 serves as the second capacitor electrode, and the remaining portion of capacitor dielectric film 50 serves as the capacitor dielectric. Of course, other unillustrated metallizations and vias will be utilized to interconnect the resulting capacitor to other elements of the integrated circuit.

As has been described, the present invention provides an improved method for fabricating a capacitor on a semiconductor substrate. According to the present invention, a lower capacitor plate is formed over a portion of the semiconductor substrate, and the region of the semiconductor substrate at which capacitor will be fabricated is defined by a masking step. Following the masking step, the capacitor dielectric and top plate are deposited. Thereafter, spin on resist is used to fill and protect the capacitor top plate, and excess metal and dielectric remaining from the deposition of the capacitor dielectric and top plate are removed by CMP. In this way, the fabrication of the capacitor requires only a single masking step, thereby substantially reducing both processing time and processing costs.

While the invention has been particularly shown and described with reference to an illustrative embodiment, it will be understood by those skilled in the art that various changes in form and detail may be made therein without departing from the spirit and scope of the invention.

What is claimed is:

1. A method of fabricating a capacitor on a semiconductor substrate utilizing only a single masking step, said method comprising:

forming a first capacitor electrode on the semiconductor substrate and forming a planar insulating layer over said first capacitor electrode;

forming a photoresist layer over said planar insulating layer and patterning said photoresist layer utilizing an only mask to form an opening over said first capacitor electrode;

through said opening, etching said planar insulating layer to form a trench in said planar insulating layer aligned with said first capacitor electrode;

after etching said planar insulating layer and before forming a capacitor dielectric layer, removing said photoresist layer;

thereafter, forming said capacitor dielectric layer directly on said planar insulating layer and in said trench;

forming a second capacitor electrode over said capacitor dielectric layer and in alignment with said first capacitor electrode; and planarizing to expose said planar insulating layer.

2. The method of claim 1, wherein forming said first capacitor electrode comprises forming a layer-one metallization on said semiconductor substrate.

3. The method of claim 1, wherein said semiconductor substrate is formed of silicon, and wherein forming said planar insulating layer comprises forming a planar layer of silicon oxide.

4. The method of claim 1, wherein forming said second capacitor electrode comprises forming a generally U-shaped structure having a trench aligned with said first capacitor electrode.

5. The method of claim 4, wherein forming said generally U-shaped structure comprises depositing a metallization layer over said capacitor dielectric layer.

6. The method of claim 4, and further comprising spinning on photoresist to fill said trench of said generally U-shaped structure prior to planarizing to expose said planar insulating layer.

7. The method of claim 6, and further comprising:

after planarizing to expose said planar insulating layer, stripping said photoresist from said trench.

8. The method of claim 1, wherein said patterning step comprises an only masking step.

9. The method of claim 1, wherein said step of forming said second capacitor electrode comprises forming a conductive layer in said trench and extending out of said trench, such that at least a portion of said conductive layer is formed over both said capacitor dielectric layer and said planar insulating layer.

10. The method of claim 9, wherein planarizing to expose said planar insulating layer comprises planarizing after forming said second capacitor electrode.

11. The method of claim 6, wherein planarizing to expose said planar insulating layer comprises planarizing by chemical-mechanical polishing (CMP).

12. A method of fabricating a capacitor on a semiconductor substrate utilizing only a single masking step, said method comprising:

forming a first capacitor electrode on the semiconductor substrate and forming a planar insulating layer over said first capacitor electrode;

forming a photoresist layer over said planar insulating layer and patterning said photoresist layer in an only masking step to form an opening over said first capacitor electrode;

through said opening, etching said planar insulating layer to form a trench in said planar insulating layer aligned with said first capacitor electrode;

thereafter, forming a capacitor dielectric layer directly on said planar insulating layer and in said trench;

forming a second capacitor electrode over said capacitor dielectric layer and in alignment with said first capacitor electrode, wherein forming said second capacitor electrode comprises forming a conductive layer in said trench and extending out of said trench, such that at least a portion of said conductive layer is formed over both said capacitor dielectric layer and said planar insulating layer; and after forming said second capacitor electrode, planarizing to expose said planar insulating layer.

13. The method of claim 12, wherein forming said first capacitor electrode comprises forming a layer-one metallization on said semiconductor substrate.

14. The method of claim 12, and further comprising:

after etching said planar insulating layer and before forming said capacitor dielectric layer, removing said photoresist layer.

15. The method of claim 12, wherein forming said second capacitor electrode comprises forming a generally U-shaped structure having a trench aligned with said first capacitor electrode.

16. The method of claim 15, and further comprising spinning on photoresist to fill said trench of said generally U-shaped structure prior to planarizing to expose said planar insulating layer.

17. The method of claim 16, and further comprising:

after planarizing to expose said planar insulating layer, stripping said photoresist from said trench.

18. A method of fabricating a capacitor on a semiconductor substrate utilizing only a single masking step, said method comprising:

forming a first capacitor electrode on the semiconductor substrate and forming a planar insulating layer over said first capacitor electrode;

forming a photoresist layer over said planar insulating layer and patterning said photoresist layer utilizing an only mask to form an opening over said first capacitor electrode;

through said opening, etching said planar insulating layer;

thereafter, forming a capacitor dielectric layer;

forming a second capacitor electrode having a generally U-shaped structure and a trench aligned with said first capacitor electrode over said capacitor dielectric layer and in alignment with said first capacitor electrode;

spinning on photoresist to fill said trench; and after spinning on the photoresist, planarizing to expose said planar insulating layer.

19. The method of claim 18, wherein forming said first capacitor electrode comprises forming a layer-one metallization on said semiconductor substrate.

20. The method of claim 18, wherein said semiconductor substrate is formed of silicon, and wherein forming said planar insulating layer comprises forming a planar layer of silicon oxide.

21. The method of claim 18, and further comprising:

after etching said planar insulating layer and before forming said capacitor dielectric layer, removing said photoresist layer.

22. The method of claim 21, wherein etching said planar insulating layer comprises forming a trench in said planar insulating layer aligned with said first capacitor electrode, and wherein forming said capacitor dielectric layer comprises forming said dielectric layer directly on said planar insulating layer and in said trench of said planar insulating layer.

23. The method of claim 18, wherein said step of forming said second capacitor electrode comprises forming a conductive layer such that at least a portion of said conductive layer is formed over both said capacitor dielectric layer and said planar insulating layer.

24. The method of claim 18, and further comprising after planarizing to expose said planar insulating layer, stripping said photoresist.

25. The method of claim 18 wherein planarizing to expose said planar insulating layer comprises planarizing after forming said second capacitor electrode.

26. The method of claim 18, wherein planarizing to expose said planar insulating layer comprises planarizing by chemical-mechanical polishing (CMP).

* * * * *